(12) United States Patent
Fuertsch et al.

(10) Patent No.: US 6,251,699 B1
(45) Date of Patent: Jun. 26, 2001

(54) METHOD FOR FABRICATING MICROMECHANICAL COMPONENTS

(75) Inventors: Matthias Fuertsch, Gomaringen; Michael Offenberg, Kirchentellinsfurt, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/617,175

(22) Filed: Jul. 17, 2000

(30) Foreign Application Priority Data

Jul. 16, 1999 (DE) .............................................. 199 33 418

(51) Int. Cl.$^7$ ..................................................... H01L 21/00
(52) U.S. Cl. ................................................................ 438/50
(58) Field of Search ........................... 438/50, 48, 51–55, 438/800; 257/254, 417, 418, 420

(56) References Cited

U.S. PATENT DOCUMENTS 6,162,657 * 12/2000 Schiele et al. .......................... 438/52

* cited by examiner

Primary Examiner—Charles Bowers
Assistant Examiner—Craig Thompson
(74) Attorney, Agent, or Firm—Kenyon & Kenyon

(57) ABSTRACT

A method for fabricating micromechanical components, which provides for depositing one or a plurality of sacrificial layers on a silicon substrate and, thereon, a silicon layer. In subsequent method steps, a structure is patterned out of the silicon layer, and the sacrificial layer is removed, at least under one section of the structure. The silicon layer is doped by an implantation process.

7 Claims, 1 Drawing Sheet

METHOD FOR FABRICATING MICROMECHANICAL COMPONENTS

FIELD OF THE INVENTION

The present invention relates to a method for fabricating micromechanical components.

BACKGROUND OF THE INVENTION

Methods are already known for fabricating micromechanical components, which employ a so-called sacrificial layer technique. In this context, a sacrificial layer is deposited on a substrate, and a resist layer is then deposited on the sacrificial layer. An element is patterned out of the resist layer, and the sacrificial layer is removed, at least under sections of this resist layer structure, in an etching process. In the process, silicon is used both for the substrate, as well as for the resist layer.

SUMMARY OF THE INVENTION

In contrast, the method according to the present invention advantageously enables the inner mechanical strains in the structure to be controlled with utmost precision.

During the course of a temperature treatment, implanted dopants are introduced into the silicon crystal lattice. By varying the dose of the dopant and the energy of the implantation, one can selectively influence the distribution of the dopant in the structure and, thus, the inner mechanical strains. In addition, mechanical strains in the structure can be reduced by depositing a coating to prevent oxygen from penetrating into the silicon of the structure during the temperature treatment. The method is particularly well suited for applications involving thick resist layers, as are obtained, for example, when an epitaxial process is used to produce the resist layer.

DETAILED DESCRIPTION

Figure 1:
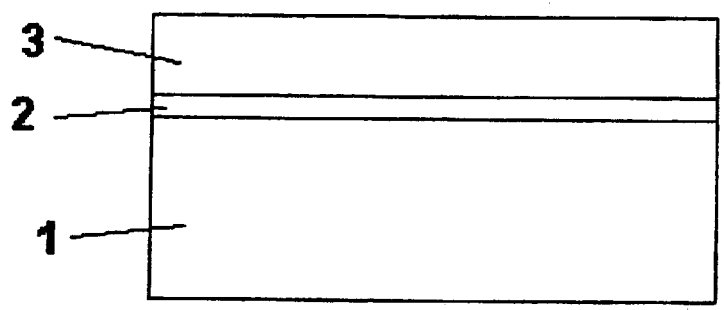
FIG. 1 shows a first illustration of a fabrication method in accordance with the present invention.
Figure 2:
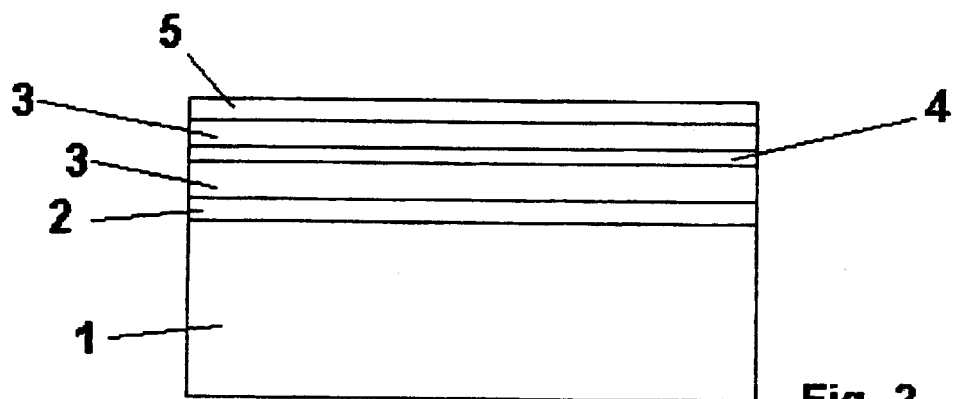
FIG. 2 shows a second illustration of the fabrication method in accordance with the present invention.
Figure 3:
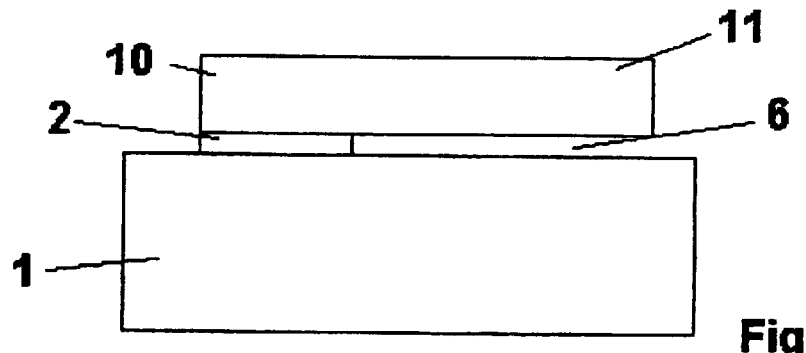
FIG. 3 shows a third illustration of the fabrication method in accordance with the present invention.

FIGS. 1 through 3 illustrate a method for fabricating micromechanical structures, in each case a cross-section being shown through the structure of the individual layers.

FIG. 1 shows a cross-section through a silicon wafer 1, upon which a sacrificial layer 2 is produced. Suited for sacrificial layers of this kind is, for example, silicon oxide, produced in an oxidation process of silicon wafer 1 or in customary deposition techniques of semiconductor technology. A thin polysilicon layer is then deposited as a nucleation layer onto this sacrificial layer 2 using a standard process of semiconductor technology. This thin polysilicon layer is not shown in FIG. 1. In a subsequent step, a thick polysilicon layer 3 is then deposited onto this thin polysilicon layer. For the deposition of this thick polysilicon layer 3, processes are used, which are customarily employed in semiconductor technology to deposit so-called epitaxial layers. In these processes, a substantially monocrystalline silicon layer is deposited onto a monocrystalline silicon substrate. Here, however, since this process is carried out on a thin polysilicon layer, no monocrystalline layer grows, but instead a polycrystalline layer grows. What is significant about this process is that thick polysilicon layers are able to be produced in short process times.

For the following description, one starts out from the assumption of sacrificial layer 2 having a thickness of about 1.5 micrometers, and of polysilicon layer 3 arranged thereon having a thickness of 11 micrometers.

For many micromechanical applications, the dopant concentration of polysilicon layer 3, deposited in these epitaxial processes, is too low. In particular, when the production of micromechanical components calls for individual parts of the structure to be conductive, dopants are still additionally introduced into polysilicon layer 3. This can be necessary, for example, when the intention is for the micromechanical structures to function as capacitive elements (for example, as capacitive acceleration sensors).

Especially cost-effective methods for introducing dopants provide for subjecting the surface of silicon layer 3 to a phosphorus-bearing gas (e.g., $POCl_3$), thereby heavily doping a surface layer of silicon layer 3. In a subsequent process, the surface is then provided with a protective layer of silicon oxide, preventing the dopant from diffusing back into a gas phase. A high-temperature treatment, for example at 1160° C., then follows, driving the initially only superficially present dopants into uppermost silicon layer 3. Since this process starts out exclusively from the surface of silicon layer 3, the dopant concentration in the depth of silicon layer 3 decreases substantially in the process. In addition, it is very difficult in processes of this kind, when working with a multiplicity of parallel-processed silicon substrates, to achieve an equivalent doping level for all silicon layers 3 arranged on silicon substrates 1. Moreover, one cannot avoid a certain variation in the dopant concentration and, thus, in the inner mechanical strain over the surface of a wafer.

This uneven distribution of dopant concentration in silicon layer 3 or among various components is not only problematic in consideration of the resultant variation in the conductivity of silicon layer 3; the dopant concentration also influences the inner mechanical strains within silicon layer 3 and, thus, the structure's curvature, once it is etched free. Below a certain concentration of dopant or phosphorus, a substantial portion of the dopants are embedded into electrically active lattice locations, thereby producing a slight tensile stress in the material. In response to an increasing dopant intensity, a growing share of the phosphorus enters into the grain boundaries, where it is not able to be electrically activated. There, it produces a compressive stress. Therefore, an uneven doping of silicon layer 3 and, in particular, a change from tensile stresses to compressive stresses, can produce intense mechanical strains within silicon layer 3, and result in curvature of exposed structures.

At this point, the present invention provides for using a method, in which silicon layer 3 is provided in an implantation process with a dopant. A silicon layer 3 of this kind is schematically depicted in FIG. 2, which represents a further processing step in accordance with FIG. 1. On the basis of FIG. 1, dopants are implanted using an implanter, as also used in semiconductor technology. Schematically depicted in FIG. 2 is a layer 4, which is situated in silicon layer 3 and which is a region of silicon layer 3 in which the largest dopant quantity is introduced. This is merely a schematic representation to illustrate that the heaviest dopant concentration is not at the surface of silicon layer 3, but is also inside silicon layer 3, as a function of the implantation energy. In actuality, however, the implantation process causes dopant atoms to be introduced into the thickness of the entire layer, at least given a thickness of silicon layer 3 on the order of 11 micrometers. In this context, the heaviest concentration typically differs by a factor of 10 from the weakest concentration. The implantation effects a much more uniform and reproducible distribution of the dopant over the surface of the wafer. Moreover, a small portion of the dopant is incorporated in grain boundaries, and the difference in mechanical strains is minimized over the cross-section of silicon layer 3.

The introduced dopants are then activated in a subsequent temperature step, for example at 1100° C. for 30 minutes, i.e., increasing the temperature promotes diffusion of the dopant atoms into the silicon, enabling them to occupy lattice locations capable of being electrically activated. In the process, of course, doping concentrations of varying intensity are once again further compensated for.

During temperature treatment, gas atoms, in particular oxygen, can diffuse into the silicon substrate for example, as background contamination, in an inert atmosphere as well. These inwardly diffused gas atoms or oxygen atoms can influence the mechanical strains in the silicon. To minimize this effect, a superficial layer 5 of silicon nitride ($SI_3N_4$) is, therefore, provided to protect silicon layer 3 from the encroachment of gas atoms during the temperature treatment, as also shown in FIG. 2. This constitutes a further measure for keeping the mechanical strains and their gradients to a minimum in silicon layer 3.

Figure 4:
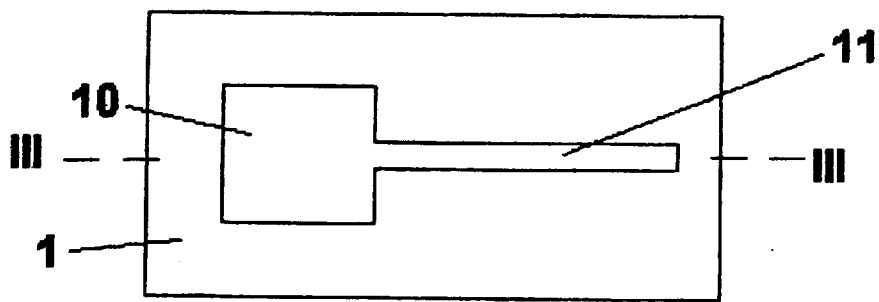
FIG. 4 shows a plan view of FIG. 3.

In further process steps, silicon-nitride protective layer 5 is then removed again, and silicon layer 3 is then patterned. In a subsequent step, sacrificial layer 2 is then etched, an etching medium being used in the process which etches sacrificial layer 2, not, however, substrate 1 or silicon layer 3. The thus attained state is shown in FIG. 3. As is discernable, a structure is formed out of top silicon layer 3. Underneath one portion of the structure, a partial region of sacrificial layer 2 still remains as an anchor, while other regions 6 underneath the structure have been etched free. FIG. 4 shows a plan view of the structure according to FIG. 3, line III—III indicating that FIG. 3 depicts a cross-section along this line through FIG. 4. As one can discern in FIG. 4, a structure having an anchoring region 10 and a movable region 11 is created on silicon substrate 1. In this context, anchoring region 10 is proportioned in its lateral dimensions so as to ensure that this anchoring region 10 is not undercut in a short time-controlled process in which sacrificial layer 2 is etched. The movable part 11 of the structure is shaped in at least one lateral dimension in such a way that, even in response to a very short application of an etching medium for sacrificial layer 2, an undercutting 6 by etching of this region follows. Thus, through pattern delineation of silicon layer 3 and a subsequent step of etching sacrificial layer 2, a structure is formed, which is partially joined to substrate 1 and partially (region 11) not joined to the substrate. Thus, by properly dimensionally designing region 11, a structure can be formed, which moves in relation to substrate 1 in response to the action of a force.

FIG. 3 shows that the created movable structure is arranged above substrate 1 more or less with a spacing equivalent to the sacrificial layer., i e on the order of 1 to 2 micrometers. Since micromechanical structures of this kind have on the order of several hundred micrometers in a direction parallel to substrate 1, even slight mechanical strains can cause the movable parts to make contact with substrate 1. Therefore, when manufacturing micromechanical structures, it is very important to precisely control the mechanical strains in silicon layer 3. This is made possible by the method according to the present invention, since it enables the mechanical strains within silicon layer 3 to be precisely controlled in this manner. Depending on the dopant concentration selected and the distribution of dopants into the depth of silicon layer 3, which is conditional upon the implantation, one can selectively target, in this manner, specific compressive stresses, tensile stresses, or a virtually stress-free condition. It is desirable in this case that silicon layer 3 exhibit only very little stress and that any residual stress cause silicon layer 3 to bend away from substrate 1.

In addition, the implantation is a process that is very easily controlled, and is reproducible, particularly over the surface of a large-surface silicon substrate 1 and, however, also when a plurality of different silicon substrates are used. This makes it possible to keep any variation among the individual structures to a minimum when mass producing micromechanical structures of this kind.

What is claimed is:

1. A method for fabricating a micromechanical component, comprising the steps of:
   producing at least one sacrificial layer on a silicon substrate;
   producing a silicon layer on the silicon substrate;
   patterning a structure out of the silicon layer;
   removing the at least one sacrificial layer at least under one section of the structure; and
   doping the silicon layer by an implantation process.

2. The method according to claim 1, further comprising the step of:
   selecting a dose for the doping so as to produce as few as possible inner mechanical strains and stress gradients in the silicon layer.

3. The method according to claim 1, further comprising the step of:
   performing a temperature treatment following the implantation process.

4. The method according to claim 3, further comprising the step of:
   prior to the temperature treatment, providing the silicon layer with a protective layer.

5. The method according to claim 4, wherein:
   the protective layer includes silicon nitride.

6. The method according to claim 1, wherein:
   a thickness of the silicon layer is greater than 10 micrometers.

7. The method according to claim 6, wherein:
   the silicon substrate corresponds to a monocrystalline silicon substrate, and
   the step of producing the silicon layer includes the step of performing an operation that, in an application on the monocrystalline silicon substrate, leads to an epitaxial growth of the silicon layer.

* * * * *